United States Patent
Yin et al.

(10) Patent No.: US 10,171,035 B2
(45) Date of Patent: Jan. 1, 2019

(54) POWER FACTOR CORRECTION CIRCUIT AND MULTIPLIER

(71) Applicant: COSEMITECH (SHANGHAI) CO., LTD, Minhang District, Shanghai (CN)

(72) Inventors: Xiaoping Yin, Shanghai (CN); Jian You, Shanghai (CN)

(73) Assignee: COSEMITECH (SHANGHAI) CO., LTD., Minhang District Shanghai (CN)

( * ) Notice: Subject to any disclaimer, the term of this patent is extended or adjusted under 35 U.S.C. 154(b) by 0 days.

(21) Appl. No.: 15/546,647

(22) PCT Filed: Jan. 25, 2016

(86) PCT No.: PCT/CN2016/072010
§ 371 (c)(1),
(2) Date: Jul. 26, 2017

(87) PCT Pub. No.: WO2016/119661
PCT Pub. Date: Aug. 4, 2016

(65) Prior Publication Data
US 2017/0373640 A1   Dec. 28, 2017

(30) Foreign Application Priority Data

Jan. 27, 2015 (CN) .......................... 2015 1 0041339

(51) Int. Cl.
*H03D 7/14* (2006.01)
*H02M 1/42* (2007.01)

(52) U.S. Cl.
CPC ........ *H03D 7/1433* (2013.01); *H02M 1/4225* (2013.01); *H03D 7/1441* (2013.01); *H03D 7/1458* (2013.01)

(58) Field of Classification Search
CPC .......... H03K 3/012; H03K 5/133; H03K 7/08; H03K 19/00; H03K 5/023; H03K 5/24;
(Continued)

(56) References Cited

U.S. PATENT DOCUMENTS

| 5,587,687 A | 12/1996 | Adams |
| 5,872,446 A | 2/1999 | Cranford, Jr. et al. |

(Continued)

FOREIGN PATENT DOCUMENTS

| CN | 101030758 A | 9/2007 |
| CN | 101090267 A | 12/2007 |

(Continued)

OTHER PUBLICATIONS

Chinese Office Action for related Chinese Application No. 2017121302199270; dated Dec. 18, 2017; 5 pages.
(Continued)

*Primary Examiner* — John Poos
(74) *Attorney, Agent, or Firm* — Cantor Colburn LLP

(57) ABSTRACT

The present invention disclosure provides a multiplier and a power factor correction circuit which the multiplier is applied. The multiplier comprises a Gilbert multiplier circuit comprising a first differential input stage, a second differential input stage and an output stage; a first differential voltage conversion circuit; a second differential voltage conversion circuit; and a bias current generating circuit; Wherein said output stage comprises: a current mirror unit comprising two current input terminals and a current output terminal; and a feedback control unit configured to ensure that the current output terminal does not output current when the voltage difference received by the multiplier is zero. The present invention is advantageous in improving the linearity of the multiplier and the accuracy of the output current of the multiplier output current.

9 Claims, 11 Drawing Sheets

(58) Field of Classification Search
CPC .... H03D 7/1433; H03D 7/1458; H03D 7/145; H03D 7/18; G05F 1/575; G05F 1/565; G05F 3/30; G05F 3/24; G05F 1/10; G05F 3/02
USPC .......... 327/116, 119, 356, 357, 358
See application file for complete search history.

(56) References Cited

U.S. PATENT DOCUMENTS

| | | | |
|---|---|---|---|
| 7,071,760 B2* | 7/2006 | Yoshida | H03D 7/1441 327/359 |
| 7,570,099 B2* | 8/2009 | Lin | H03D 7/145 327/356 |
| 2003/0184366 A1 | 10/2003 | Yoshida | |
| 2008/0001658 A1 | 1/2008 | Mojarradi et al. | |
| 2011/0193587 A1 | 8/2011 | Payson | |
| 2013/0336031 A1 | 12/2013 | McCune, Jr. | |

FOREIGN PATENT DOCUMENTS

| | | |
|---|---|---|
| CN | 102594118 A | 7/2012 |
| CN | 102710118 A | 10/2012 |
| CN | 103066827 A | 4/2013 |
| CN | 103199852 A | 7/2013 |

OTHER PUBLICATIONS

Chinese Office Action and Search Report for Chinese Application No. 201510041339.0 dated Apr. 18, 2018, 6 pages.

* cited by examiner

POWER FACTOR CORRECTION CIRCUIT AND MULTIPLIER

CROSS-REFERENCES TO RELATED APPLICATIONS

This patent application is a 371 of International Application No. PCT/CN2016/072010, filed Jan. 25, 2016 which claims the priority of Chinese Application No. 201510041339.0, filed Jan. 27, 2015, which is incorporated herein by reference in their entirety.

TECHNICAL FIELD

The invention relates to the technical field of power supply management, and particularly relates to a multiplier and a power factor correction circuit in which the multiplier is applied.

BACKGROUND

In order to more efficiently utilize the power grid electric energy, a switch power supply technology has begun to be widely applied in power factor correction techniques. In the prior art, it is common practice to insert a power factor correction (PFC) circuit between the diode rectifier bridge and the load of the circuit so that the current drawn from the AC power supply also is a sine wave signal, and its phase follows changes in supply voltage. After the addition of the power factor correction circuit the power factor value may be close to 1.

A PFC circuit implementation as shown in FIG. 1, is applied to a boost converter (BOOST CONVERTER). The converter comprises an inductor L, a switch device S, a freewheeling diode D, an output capacitor Cout, and an integrated PFC circuit. The supply voltage Vac passes through the diode rectifier bridge as an input for boost converter. The boost converter converts the input voltage to obtain the output voltage Vout. The PFC circuit comprises an error amplifier U1, an multiplier U2, a comparator U3, a RS flip-flop U4, a driving module U5 and a zero current detection circuit (ZCD) U6. The PFC circuit samples the output voltage Vout and inputs it to the error amplifier U1. One input of the multiplier U2 is the output error feedback signal Verror of the error amplifier U1 and the other input is the divided signal Vin of the supply voltage Vac so that the output current waveform becomes a sine wave following the power supply voltage waveform. The sampling resistor R1 and the external switching device S are connected in series to obtain a switching current signal. When the voltage across the sampling resistor R1 is higher than the output of the multiplier U2, the comparator U3 and the RS flip-flop U4 are turned over and the external switching device S is turned off by the driving module U5. When the zero current detection circuit U6 detects that the inductor current drops to 0, the external switching device S is turned on. Through the above control mode, the critical conduction mode control is realized, and the realization is in a simple way, and especially suitable for the configuration of power factor correction circuit with small and medium power.

However, there are still some problems should be improved in the current technology, such as the accuracy of the output current.

SUMMARY

Aiming at some or all of the problems in the prior art, the present invention provides a multiplier and a power factor correction circuit in which the multiplier is applied.

Other characteristics and advantages of the invention will become apparent, or in part, be gotten by the practice of this disclosure, as described below.

According to a first aspect of the present invention, there is provided a multiplier comprising:

a Gilbert multiplier circuit comprising a first differential input stage, a second differential input stage and an output stage; said output stage outputting the output current calculated by the input of said first differential input stage and the input of the second differential input stage;

a first differential voltage conversion circuit configured to generate a first differential voltage to bias said first differential input stage based on the received voltage signal and a first reference voltage;

a second differential voltage conversion circuit configured to generate a second differential voltage to bias said second differential input stage based on the received voltage signal and a second reference voltage; and a bias current generating circuit configured to generate a bias current to bias said first signal conversion circuit and said second signal conversion circuit;

Wherein said output stage comprises:

a current mirror unit comprising two current input terminals and a current output terminal; and a feedback control unit configured to ensure that the current output terminal does not output current when the voltage difference received by said multiplier is zero.

In one exemplary embodiment of the present invention, said current mirror unit is composed of a P type MOSFET transistor.

In one exemplary embodiment of the present invention, said second differential voltage conversion circuit comprises:

a MOSFET transistor comprising a gate electrode, a drain electrode connected to said gate electrode, and a source electrode connected to a supply voltage;

a pair of first BJT transistors comprising two NPN type first BJT transistors, base electrodes and collector electrodes of two said first BJT transistors connected to the drain electrode of said MOSFET transistor; emitter electrodes output said second differential voltage;

a pair of second BJT transistors comprising two NPN type second BJT transistors, base electrodes of two said second BJT transistors receiving two different voltage signals respectively, collector electrodes connected to the emitter electrodes of said first BJT transistors respectively;

a first resistor coupled between the emitter electrodes of two said second BJT transistors; and a pair of first MOSFET transistors comprising two first MOSFET transistors; gate electrodes of two said first MOSFET transistors receiving said bias current, source electrodes grounded, and drain electrodes connected to the emitter electrodes of said second BJT transistors respectively.

In one exemplary embodiment of the present invention, the base electrode of one said second BJT transistor receives said input voltage or an error feedback voltage, and the base electrode of the other said second BJT transistor receives said second reference voltage.

In one exemplary embodiment of the present invention, said first differential voltage conversion circuit comprises:

a pair of second MOSFET transistors comprising two second MOSFET transistors, gate electrodes of two said second MOSFET transistors connected to drain electrodes, source electrodes connected to said supply voltage;

a pair of third BJT transistors comprising two third BJT transistors, base electrodes of two said third BJT transistors receiving two different voltage signals respectively, collector electrodes connected to the drain electrodes of said second MOSFET transistors respectively;

a second resistor coupled between the emitter electrodes of two said third BJT transistors;

a pair of third MOSFET transistors comprising two third MOSFET transistors, gate electrodes of two said third MOSFET transistors receiving said bias current, source electrodes grounded, and drain electrodes connected to the emitter electrodes of said third BJT transistor respectively;

a pair of fourth MOSFET transistors comprising two fourth MOSFET transistors; gate electrodes of two said fourth MOSFET transistors connected to the gate electrodes of said second MOSFET transistors respectively; source electrodes connected to said supply voltage;

a pair of fourth BJT transistors comprising two NPN type fourth BJT transistors, base electrodes of two said fourth BJT transistors connected to the drain electrodes of said fourth MOSFET transistors respectively, collector electrodes outputting said first differential voltage;

a BJT transistor comprising a base electrode, a collector electrode connected to said base electrode and the emitter electrodes of said fourth BJT transistors, an emitter electrode thereof grounded.

In one exemplary embodiment of the present invention, the base electrode of one said third BJT transistor receives said input voltage or an error feedback voltage, and the base electrode of the other third BJT transistor receives said first reference voltage.

In one exemplary embodiment of the present invention, said output stage comprises a current mirror unit comprising two current input terminal and a current output terminal. Said output stage further comprises:

a first operational amplifier comprising two input terminals connected to the current input terminals of said current mirror unit respectively;

a first switching element comprising a first terminal connected to the current output terminal of said current mirror unit, a second terminal connected to the input terminal of said first operational amplifier, and a control terminal connected to an output terminal of said first operational amplifier; and a second switching element comprising a first terminal connected to the current output terminal of said current mirror unit, a second terminal configured to output said output current, and a control terminal connected to the output terminal of said first operational amplifier.

According to a third aspect of the present invention, there is provided a multiplier comprising:

a Gilbert multiplier circuit comprising a first differential input stage, a second differential input stage and an output stage; said output stage outputting the output current calculated by the input of said first differential input stage and the input of the second differential input stage;

a first differential voltage conversion circuit configured to generate a first differential voltage to bias said first differential input stage based on the received voltage signal and a first reference voltage;

a second differential voltage conversion circuit configured to generate a second differential voltage to bias said second differential input stage based on the received voltage signal and a second reference voltage; and a bias current generating circuit configured to generate a bias current to bias said first signal conversion circuit and the second signal conversion circuit;

Wherein said output stage comprises a current mirror unit comprising two current input terminals and a current output terminal. Said output stage further comprises:

a first operational amplifier comprising two input terminals connected to the current input terminals of said current mirror unit respectively;

a first switching element comprising a first terminal connected to the current output terminal of said current mirror unit, a second terminal connected to one input terminal of said first operational amplifier, and a control terminal connected to an output terminal of said first operational amplifier; and a second switching element comprising a first terminal connected to the current output terminal of said current mirror unit, a second terminal configured to output said output current, and a control terminal connected to the output terminal of said first operational amplifier.

In one exemplary embodiment of the present invention, said second differential voltage conversion circuit comprises:

a MOSFET transistor comprising a gate electrode, a drain electrode connected to said gate electrode, and a source electrode connected to a supply voltage;

a pair of first BJT transistors comprising two NPN type first BJT transistors, base electrodes and collector electrodes of two said first BJT transistors connected to the drain electrode of said MOSFET transistor; emitter electrodes outputting said second differential voltage;

a pair of second BJT transistors comprising two NPN type second BJT transistors, base electrodes of two said second BJT transistors receiving two different voltage signals respectively, collector electrodes connected to the emitter electrodes of said first BJT transistors respectively;

a first resistor coupled between the emitter electrodes of said second BJT transistors; and a pair of first MOSFET transistors comprising two first MOSFET transistors; gate electrodes of two said first MOSFET transistors receiving said bias current, source electrodes grounded, and drain electrodes connected to the emitter electrodes of said second BJT transistors respectively.

In one exemplary embodiment of the present invention, the base electrode of one said second BJT transistor receives said input voltage or an error feedback voltage, and the base electrode of the other said second BJT transistors receives said second reference voltage.

In one exemplary embodiment of the present invention, said first differential voltage conversion circuit comprises:

a pair of second MOSFET transistors comprising two second MOSFET transistors, gate electrodes of two said second MOSFET transistors connected to drain electrodes, source electrodes connected to said supply voltage;

a pair of third BJT transistors comprising two third BJT transistors, base electrodes of two said third BJT transistors receiving two different voltage signal respectively, collector electrodes connected to the drain electrodes of said second MOSFET transistors respectively;

a second resistor coupled between the emitter electrodes of said third BJT transistors;

a pair of third MOSFET transistors comprising two third MOSFET transistors, gate electrodes of two said third MOSFET transistors receiving said bias current, source electrodes grounded, and drain electrodes connected to the emitter electrodes of said third BJT transistor respectively;

a pair of fourth MOSFET transistors comprising two fourth MOSFET transistors; gate electrodes of two said fourth MOSFET transistors connected to the gate electrodes of said second MOSFET transistors respectively; source electrodes connected to said supply voltage;

a pair of fourth BJT transistors comprising two NPN type fourth BJT transistors, base electrodes of two said fourth BJT transistors connected to the drain electrodes of said fourth MOSFET transistors respectively, collector electrodes outputting said first differential voltage;

a BJT transistor comprising a base electrode, a collector electrode connected to a base electrode thereof and the emitter electrodes of said fourth BJT transistors, an emitter electrode grounded.

In one exemplary embodiment of the present invention, the base electrode of one said third BJT transistor receives said input voltage or an error feedback voltage, and the base electrode of the other said third BJT transistor receives said first reference voltage.

In one exemplary embodiment of the present invention, said multiplier further comprises:

a voltage feed-forward circuit; the bias current generating circuit generates said bias current based on a voltage supplied from said voltage feed-forward circuit.

According to a second aspect of the present invention, there is provided a power factor correction circuit comprising any of the multipliers described above.

In one exemplary embodiment of the present invention, said power factor correction circuit is formed in an integrated circuit module.

In the multiplier of the exemplary embodiment of the present invention, the feedback control unit is provided, and the feedback control unit provides the feedback control to improve the output current accuracy of the multiplier, to ensure that when the input voltage error is 0, no current is output, that is more precise control of the multiplier offset voltage.

BRIEF DESCRIPTION OF THE FIGURES

The above and other features and advantages of the present invention will become more apparent by describing in detail the exemplary embodiments thereof with reference to the accompanying drawings.

DESCRIPTION OF THE LABEL

Figure 1:
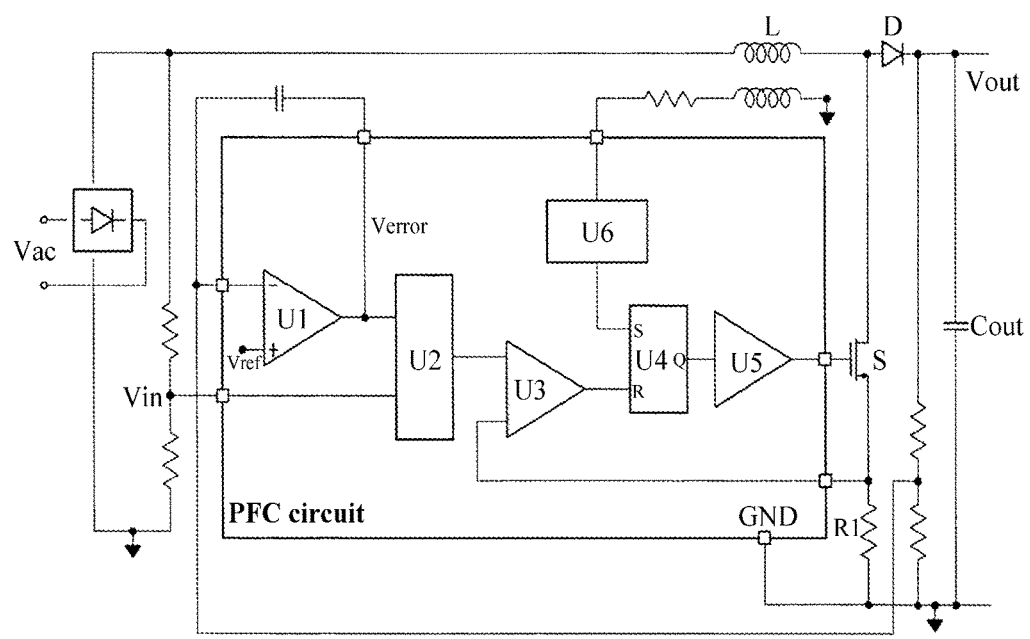
FIG. 1 is a schematic structural view of a prior art boost converter structure employing a PFC circuit.

Background Technique
L inductance
S switch devices
D freewheeling diode
Cout output capacitor
R1 sampling resistor
U1 error amplifier
U2 multiplier
U3 Comparator
U4 RS Trigger
U5 drive module
Vac supply voltage
Vin input voltage
Vout output power

DETAILED DESCRIPTION

C1 first capacitor
C2 second capacitor
D1 first reverse bias PN junction
D2 second reverse bias PN junction
S1 first switching element
S2 second switching element
S3 third switching element
S4 fourth switching element
S5 fifth switching element
S6 sixth switching element
Φ1 first control signal
Φ2 second control signal
Φ3 third control signal
Φ4 fourth control signal
U1 first operational amplifier
U2 logic control unit
U3 first comparator
U4 second comparator
R1 first resistance
R2 second resistance
R3 third resistance
Q1-Q6 BJT transistor
Q50 BJT Transistor
Q11, Q12 first BJT transistor
Q21, Q22 second BJT transistor
Q31, Q32 third BJT transistor
Q41, Q42 fourth BJT transistor
M0-M5 field-effect transistor
M11, M12 first MOSFET transistor
M21, M22 second MOSFET transistor
M31, M32 third MOSFET transistor
M41, M42 fourth MOSFET transistor
Vcc supply voltage
Vref reference voltage
Vin input voltage
Verror error feedback voltage
Vff peak voltage
Vref1 first reference voltage
Vref2 second reference voltage
IBias bias current
IEE current source
Iout output current

DETAILED DESCRIPTION

The example embodiments will now be described more fully with reference to the accompanying drawings. However, the example embodiments may be embodied in many forms and should not be construed as limited to the embodiments set forth herein; rather, those embodiments are provided so that this disclosure will be thorough and complete, and will fully convey the concepts of example embodiments to the technical staff in the field. In addition, the technical features or circuit structures described may be combined in one or more embodiments in any suitable manner. In the following description, numerous specific details are set forth to show a full understanding of the embodiments of the present disclosure. However, those skilled in the art will appreciate that the technical solution of the present disclosure may be practiced without one or more said specific details.

Some words are used in the specification and claims to refer to specific components, and technical personnel in this field should be able to understand the different components that may be used to refer to the same component. The specification and claims are not distinguished by the names of the components, but rather by the functional differences in the components as a criterion for differentiation. The term "including" which is referred to as "an open" in the entire description and claims shall be construed as "including but not limited to". In addition, the term "connection" includes any direct and indirect means of electrical connection.

In the embodiment of the invention, a multiplier is firstly provided. The multiplier may include a Gilbert multiplier circuit and a bias current generating circuit; since the Gilbert multiplier circuit achieves the product of the respective hyperbolic tangent functions of the two voltages, in order to achieve a direct product between the two voltages, it is necessary to firstly convert the input voltage from the voltage to the differential current, converted differential current is then passed through a pair of BJT (bipolar transistor) transistors to produce a differential voltage, thereby obtaining an inverse hyperbolic tangent function. Thus, in the present exemplary embodiment, the multiplier further includes a first differential voltage conversion circuit and a second differential voltage conversion circuit. Of course, it will be readily appreciated by those skilled in the art that the multiplier circuit may also be of another type of circuit, and the first differential voltage conversion circuit and the second differential voltage conversion circuit may also be selected as desired, etc. This is not the case in the example implementation.

Figure 2:
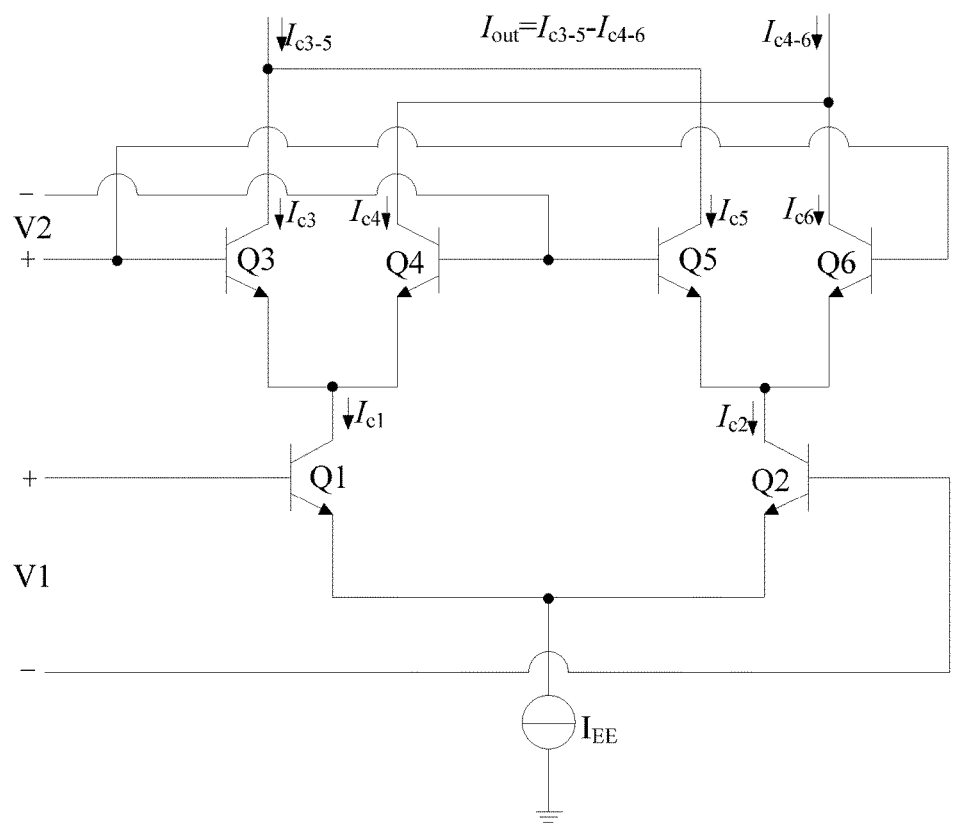
FIG. 2 is a schematic structural view of a Gilbert multiplier circuit according to an exemplary embodiment of the present invention.

As shown in FIG. 2, the schematic diagram of a Gilbert multiplier circuit is presented. The Gilbert multiplier circuit is a core unit of the multiplier including a first differential input stage consisting of BJT transistors Q1 to Q2, a second differential input stage consisting of BJT transistors Q3-Q6, and an output stage, where the current source $I_{EE}$ provides the bias current $I_{EE}$ to the Gilbert multiplier circuit. The output stage of the Gilbert multiplier outputs the output current Iout calculated by the input of the first differential input stage and the input of the second differential stage. In the present exemplary embodiment, the Gilbert multiplier circuit employs a bipolar transistor because the exponential characteristics of the bipolar device make the linearity better than the multiplier using the field effect device.

Figure 3:
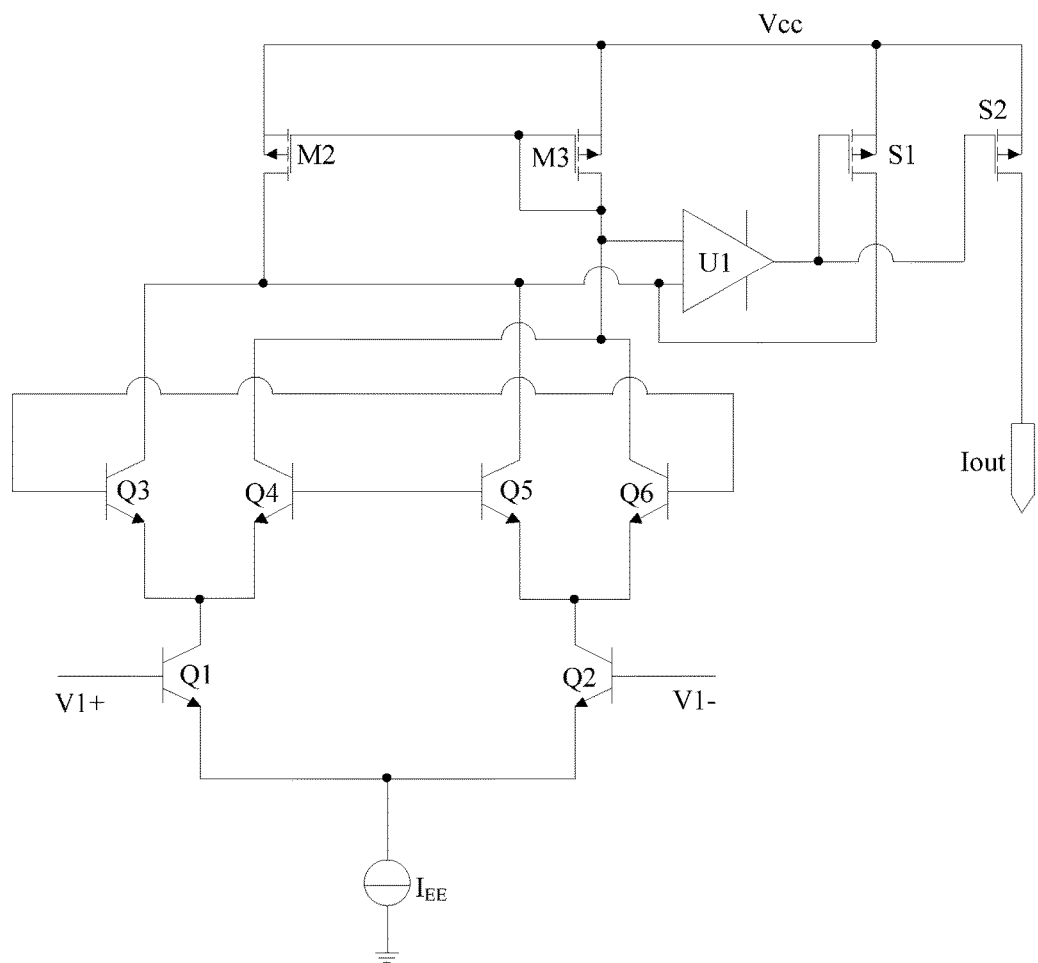
FIG. 3 is a schematic structural view of another Gilbert multiplier circuit in an exemplary embodiment of the present invention.

In the embodiment of the invention, the output stage of the Gilbert multiplier circuit includes a current mirror unit and the output current (Iout) of the Gilbert multiplier circuit needs to be output by the current mirror unit. Due to technical limitations, the current mirror unit can only use PMOS devices (i.e., the P type MOSFET transistors M2, M3, as shown in FIG. 3). When the current mirror composed of PMOS devices is used for direct output, because the output resistance is small, when the multiplier receives a voltage difference of 0, it may also have a small current output. A folding structure may be considered in one solution, but may be associated with limited voltage space conflicts. In the embodiment of the invention, a feedback control unit is arranged to ensure that the current output terminal has no current output when the voltage signal difference received by the multiplier is zero. For example, the feedback control unit may include a first operational amplifier U1, the first operational amplifier U1 is used to form a feedback to ensure that the output current Iout has a high accuracy. The specific circuit is shown in FIG. 3. The current mirror unit includes two current input terminals and a current output terminal, and the output stage also includes a first operational amplifier U1, a first switching element S1 and a second switching element S2. The two input terminals of the first operational amplifier U1 are connected to the current input terminals of the current mirror unit respectively. The first terminal of the first switching element S1 is connected to the current output terminal of the current mirror unit, the second terminal of the first switching element S1 is connected to the input terminal of the first operational amplifier U1, and the control terminal of the first switching element S1 is connected to an output terminal of the first operational amplifier U1. The first terminal of second switching element S2 is connected to the current output terminal of the current mirror unit, the second terminal of the second switching element S2 is configured to output the output current, and the control terminal of second switching element S2 is connected to the output terminal of the first operational amplifier U1. The above circuit ensures that the current output terminal does not output current when the voltage difference received by the multiplier is zero, to get zero offset voltage, which can more accurately control the offset voltage multiplier.

Figure 4:
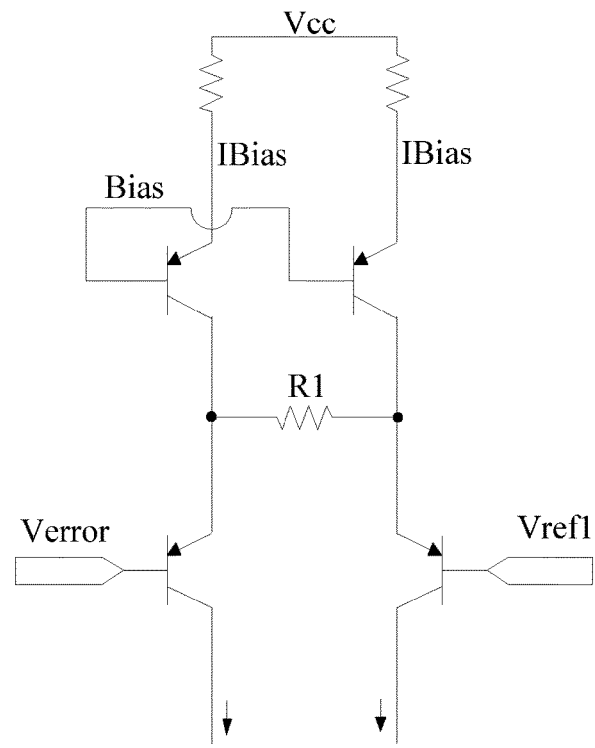
FIG. 4 is a schematic structural view of a differential current conversion circuit according to an exemplary embodiment of the present invention.
Figure 5:
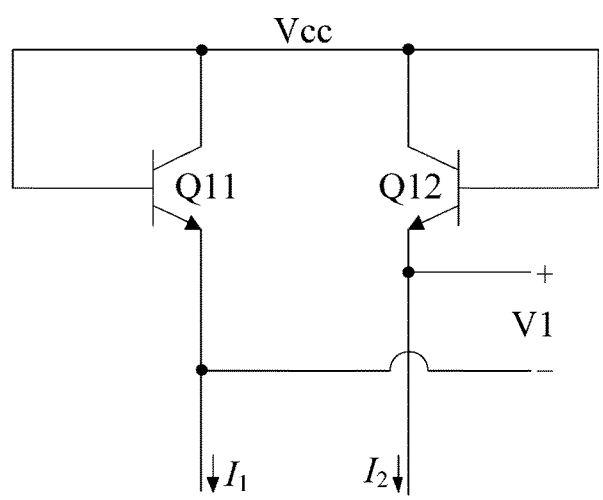
FIG. 5 is a schematic structural view of an inverse hyperbolic tangent circuit according to an exemplary embodiment of the present invention.

The first differential voltage conversion circuit is configured to generate a first differential voltage to bias the first differential input stage based on the received voltage signal and a first reference voltage Vref1. In this example embodiment, the voltage signal received by the first differential voltage conversion circuit is an error feedback voltage Verror. Of course, in other embodiments, the first differential voltage conversion circuit can also be used for other voltage signals. Specifically, the error feedback voltage Verror needed to be conversed from the voltage to the differential current at first. For example, a differential current conversion circuit is shown in FIG. 4. In order to realize the conversion from the voltage to the differential current in FIG. 4, the PNP type BJT transistor is used so that the voltage difference between the input voltage and the first reference voltage Vref1 generates a differential current on the first resistor R2. The generated differential current then passes through a pair of BJT transistors as shown in FIG. 5 to generate a differential voltage, thereby obtaining an inverse hyperbolic tangent function.

The second differential voltage conversion circuit is configured to generate a second differential voltage to bias the second differential input stage based on the received voltage signal and a second reference voltage Vref2. In this example embodiment, the voltage signal received by the second differential voltage conversion circuit is the input voltage Vin. Of course, in other embodiments, the second differential voltage conversion circuit may also receive other voltage signals. Specifically, the input voltage Vin is converted from a voltage to a differential current at first, And then converted by the inverse hyperbolic tangent function. The differential current conversion circuit and the inverse hyperbolic circuit are similar to those in FIG. 4 and FIG. 5. No more details here. In addition, in order to increase the range of the inputted input voltage Vin, a minimum input voltage Vin close to 0V can be obtained using a voltage follower.

Due to process limitations, it may not be possible to provide PNP devices with good performance. The differential current conversion circuit in FIG. 4 can only realize a function similar to level conversion, so it can also be replaced by the NPN type BJT transistor in theory. Therefore, in this example implementation, the first differential voltage conversion circuit and the second differential voltage conversion circuit are improved hereby, so that both of them can be realized by using the NPN type BJT transistors, thereby greatly expanding the use range of the circuit. Moreover, without using of PNP devices, the requirements of the process can also be reduced. In addition, the NPN device has a high gain (Beta), so it can also reduce the error to a certain extent.

Figure 6:
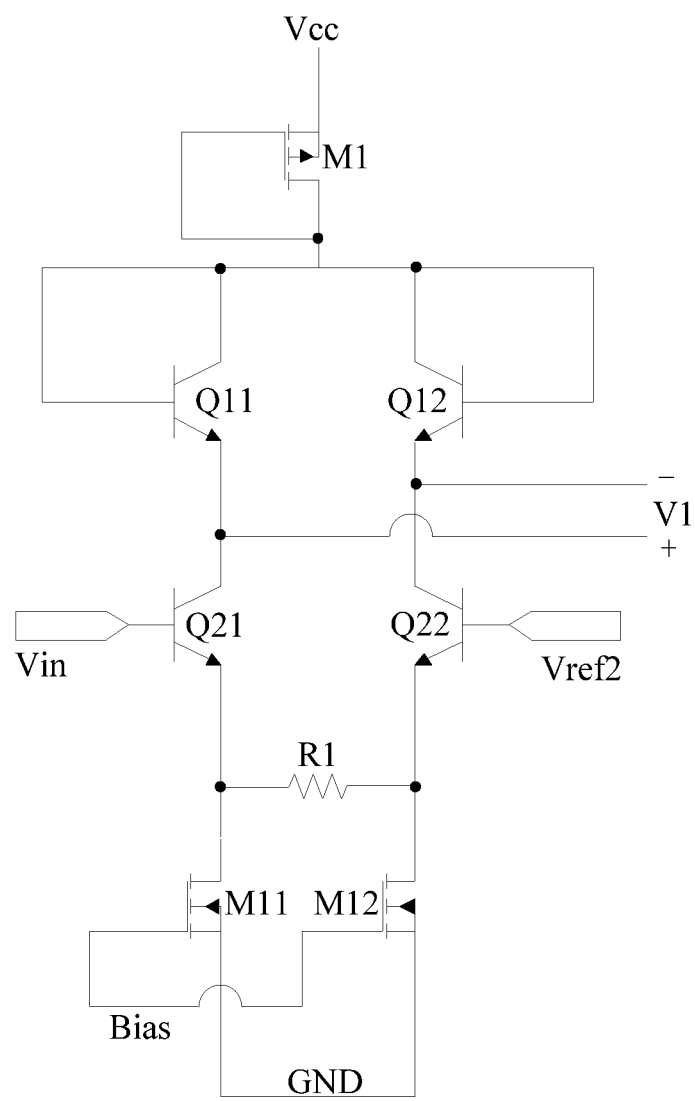
FIG. 6 is a schematic structural view of a second differential voltage conversion circuit in an exemplary embodiment of the present invention.

As shown in FIG. 6, the second differential voltage conversion circuit can include a MOSFET transistor M1, a pair of first BJT transistors including two NPN type first BJT transistors, a pair of second BJT transistors including two NPN type second BJT transistors, a first resistor R1, and a pair of first MOSFET transistors. The MOSFET transistor M1 includes a gate electrode, and a drain electrode connected to the gate electrode, a source electrode of the MOSFET transistor is connected to a supply voltage Vcc. The pair of first BJT transistors includes two NPN type first BJT transistors Q11 and Q12, base electrodes and collector electrodes of two first BJT transistors are connected to the drain electrode of the MOSFET transistor, emitter electrodes outputting the second differential voltage. The pair of second BJT transistors includes two NPN type second BJT transistors Q21 and Q22, base electrodes of two second BJT transistors receiving two different voltage signals respectively, collector electrodes of two second BJT transistors are connected to the emitter electrodes of the first BJT transistors respectively. The first resistor R1 is coupled between the emitter electrodes of the second BJT transistors. The pair of first MOSFET transistors includes two first MOSFET transistors M11 and M12; gate electrodes of two first MOSFET transistors receiving the bias current, source electrodes are grounded, and drain electrodes of first MOSFET transistors are connected to the emitter electrodes of the second BJT transistor respectively.

Figure 7:
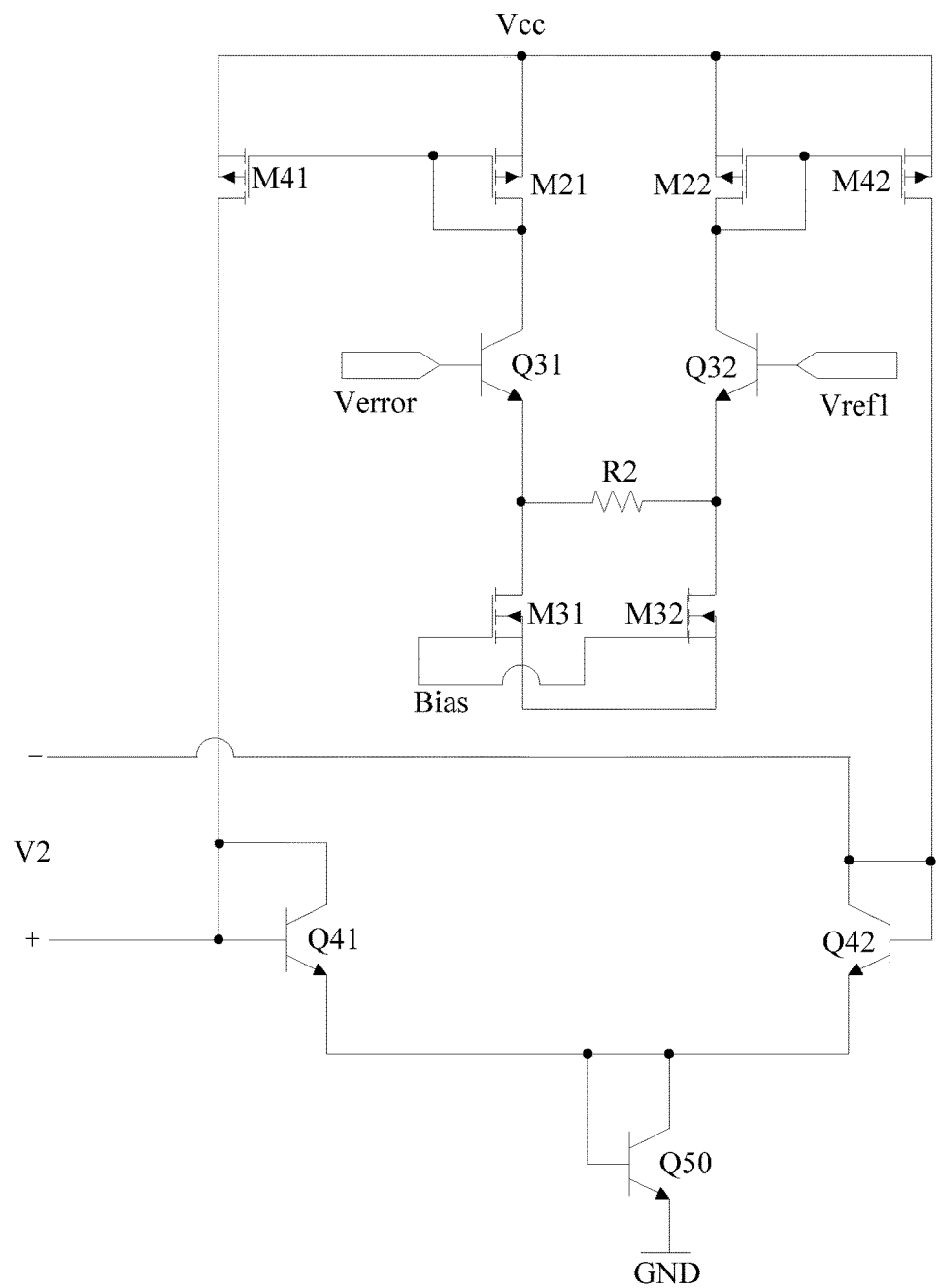
FIG. 7 is a schematic structural view of a first differential voltage conversion circuit according to an exemplary embodiment of the present invention.

As shown in FIG. 7, the first differential voltage conversion circuit includes a pair of second MOSFET transistors, a pair of third BJT transistors, a second resistor R2, a pair of third MOSFET transistors, a pair of fourth MOSFET transistors, a pair of fourth BJT transistors and a BJT transistor Q50. The pair of second MOSFET transistors includes two second MOSFET transistors M21 and M22, gate electrodes of two second MOSFET transistors are connected to drain electrodes, source electrodes of two second MOSFET transistors are connected to the supply voltage Vcc. The pair of third BJT transistors includes two third BJT transistors Q31 and Q32, base electrodes of two third BJT transistors receives two different voltage signals respectively, collector electrodes of third BJT transistors are connected to the drain electrodes of the second MOSFET transistors respectively. The second resistor R2 is coupled between the emitter electrodes of the third BJT transistor. The pair of third MOSFET transistors includes two third MOSFET transistors M31 and M32, gate electrodes of two third MOSFET transistors receive the bias current, source electrodes are grounded, and drain electrodes of two third MOSFET transistors are connected to the emitter electrodes of the third BJT transistor respectively. The pair of fourth MOSFET transistors includes two fourth MOSFET transistors M41 and M42; gate electrodes of two fourth MOSFET transistors are connected to the gate electrodes of the second MOSFET transistors respectively; source electrodes of two fourth MOSFET transistors are connected to the supply voltage Vcc. The pair of fourth BJT transistors includes two NPN type fourth BJT transistors Q41 and Q42, base electrodes of two fourth BJT transistors are connected to the drain electrodes of the fourth MOSFET transistors respectively, collector electrodes of two fourth BJT transistors output the first differential voltage. The BJT transistor Q50 includes a base electrode, a collector electrode connected to the base electrode and the emitter electrodes of the fourth BJT transistors, an emitter electrode of the BJT transistor Q50 is grounded. The BJT transistor Q50 can raise the DC operating level.

Figure 8:
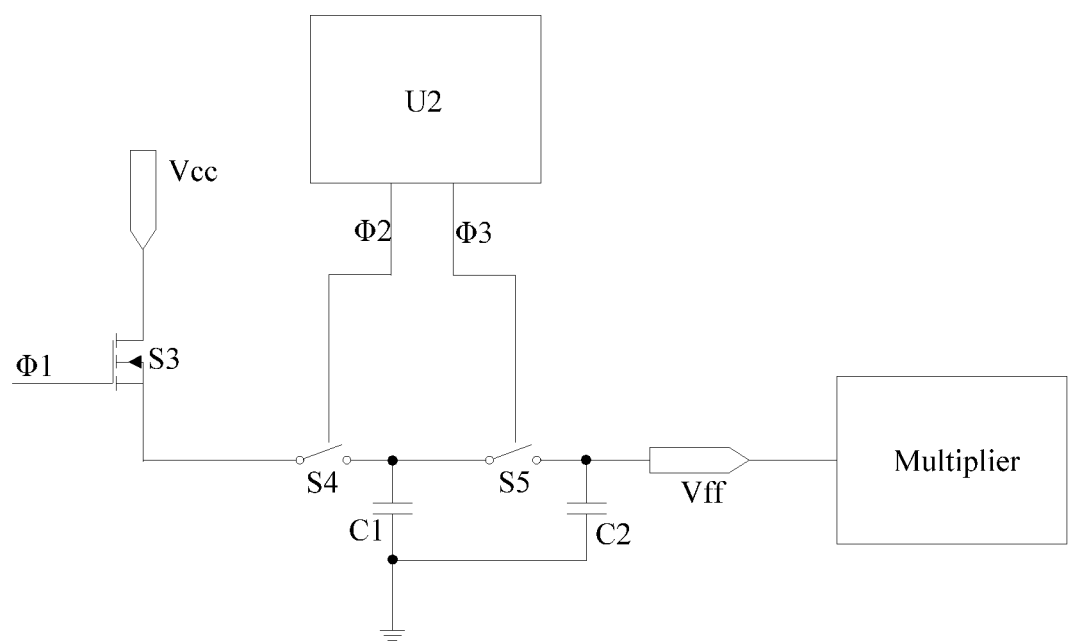
FIG. 8 is a schematic structural view of a voltage feed-forward circuit according to an exemplary embodiment of the present invention.
Figure 10:
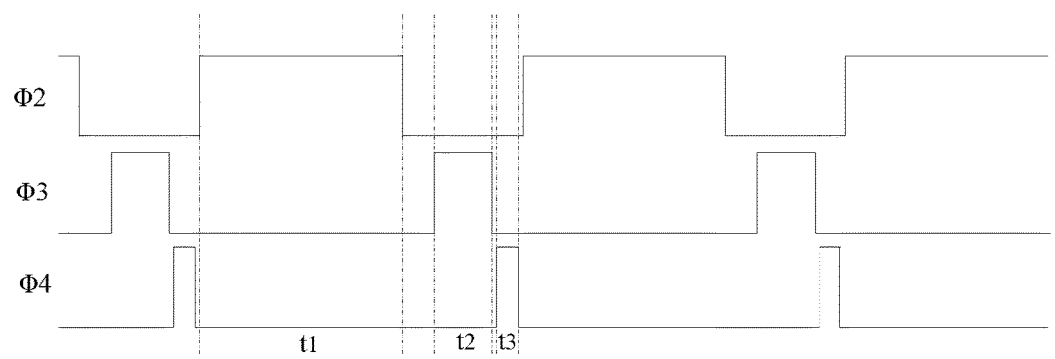
FIG. 10 is a timing chart of a control signal of a voltage feed-forward circuit according to an exemplary embodiment of the present invention.

The bias current generating circuit is configured to generate a bias current to bias a first signal conversion circuit and a second signal conversion circuit, based on an external input voltage, such as a voltage Vff provided by a voltage feed-forward circuit, and then to be converted by $1/V^2$. In this example embodiment, the voltage feed forward circuit is configured to maintain and output a peak voltage of the input voltage to the voltage feed-forward circuit. In this example embodiment, the input voltage is derived from a voltage proportional to an AC supply voltage. As shown in FIG. 8, the voltage feed-forward circuit this example embodiment includes a logic control unit U2, a third switching element S3 and a fourth switching element S4, a fifth switching element S5, a first capacitor and a second capacitor C1, C2 and so on. In this example embodiment, the switching element may include one or more of the MOSFET switch, the IGBT switch, or the BJT switch. Wherein:

The first terminal of the third switching element S3 is connected with a power supply voltage Vcc which is at least higher than the peak voltage of the input voltage Vin, the control terminal of the third switching element S3 is responsive to a first control signal Φ1 to turn on the third switching element S3. The logic control unit U2 is configured to output a second control signal Φ2 during a peak voltage of the input voltage Vin and a third control signal Φ3 during a non-peak voltage of the input voltage Vin. Referring to the control signal timing chart outputted from the logic control unit U2 as shown in FIG. 10, it can be seen that the second control signal Φ2, the third control signal Φ3, and the fourth control signal Φ4 described below have non-overlapping time, so as to avoid interference and produce noise. The first terminal of the first capacitor C1 is grounded. The first terminal of the fourth switching element S4 is connected to the second terminal of the third switching element S3. The second terminal of the fourth switching element S4 is connected to the second terminal of the first capacitor C1. The control terminal of the fourth switching element S4 is responsive to the second control signal Φ2 to turn on the fourth switching element S4. The first terminal of the fifth switching element S5 is connected to the second terminal of the first capacitor C1. The control terminal of the fifth switching element S5 is responsive to the third control signal Φ3 to turn on the fifth switching element S5. The first terminal of the second capacitor C2 is grounded. The second terminal of capacitor C2 is connected to the second terminal of the fifth switching element S5. The first control signal Φ1 and the second control signal Φ2 are provided at same time. And the first control signal Φ1 is stopped to be provided when the voltage of the second terminal of the first capacitor C1 is higher than the peak voltage of the input voltage Vin.

In the voltage feed-forward circuit, a first control signal Φ1 and a second control signal Φ2 are provided during the peak voltage of the input voltage Vin to turn on the third switching element S3 and the fourth switching element S4. So that the supply voltage Vcc charges the first capacitor C1 via the third switching element S3 and the fourth switching element S4. When the first capacitor C1 is charged to the peak voltage of the input voltage Vin, the first control signal Φ1 is stopped to be provided, and the charging of the first capacitor C1 is stopped. The fourth switching element S4 is turned off during a non-peak voltage of the input voltage Vin and a third control signal Φ3 is provided to turn on the fifth switching element S5, the second terminal of the first capacitor C1 and the second terminal of the second capacitor C2 are connected, and the charge stored in the first capacitor C1 is redistributed between the first capacitor C1 and the second capacitor C2. The peak voltage of the input voltage Vin can be shared to the second terminal of the second capacitor C2 and output from the second terminal of the second capacitor C2 to the multiplier. And finally the voltage output from the second terminal of the second capacitor C2 is:

$$Vff = (V_{C1} \times C1 + V_{C2} \times C2)/(C1+C2) \quad (1)$$

Wherein $V_{C1}$ is a voltage before redistribution of charge at a second terminal of the first capacitor C1, and $V_{C2}$ is a voltage before redistribution of charge at a second terminal of the second capacitor C2.

In the voltage feed-forward circuit, if the input voltage Vin is abruptly changed, since the charge is shared and redistributed between the first capacitor C1 and the second capacitor C2. The voltage Vff outputted from the second terminal of the second capacitor C2 can be made to be slowly changed, thereby contributing to eliminating or reducing the adverse effect of the transient fluctuation of the input voltage Vin. And after several cycles it is possible to track and maintain the peak voltage of the input voltage Vin. In addition, in the present exemplary embodiment, the capacitance ratio between the first capacitor C1 and the second capacitor C2 is adjustable. The rate of change in the voltage output from the second terminal of the second capacitor C2 can be adjusted by controlling the capacitance ratio between the first capacitor C1 and the second capacitor C2.

Figure 9:
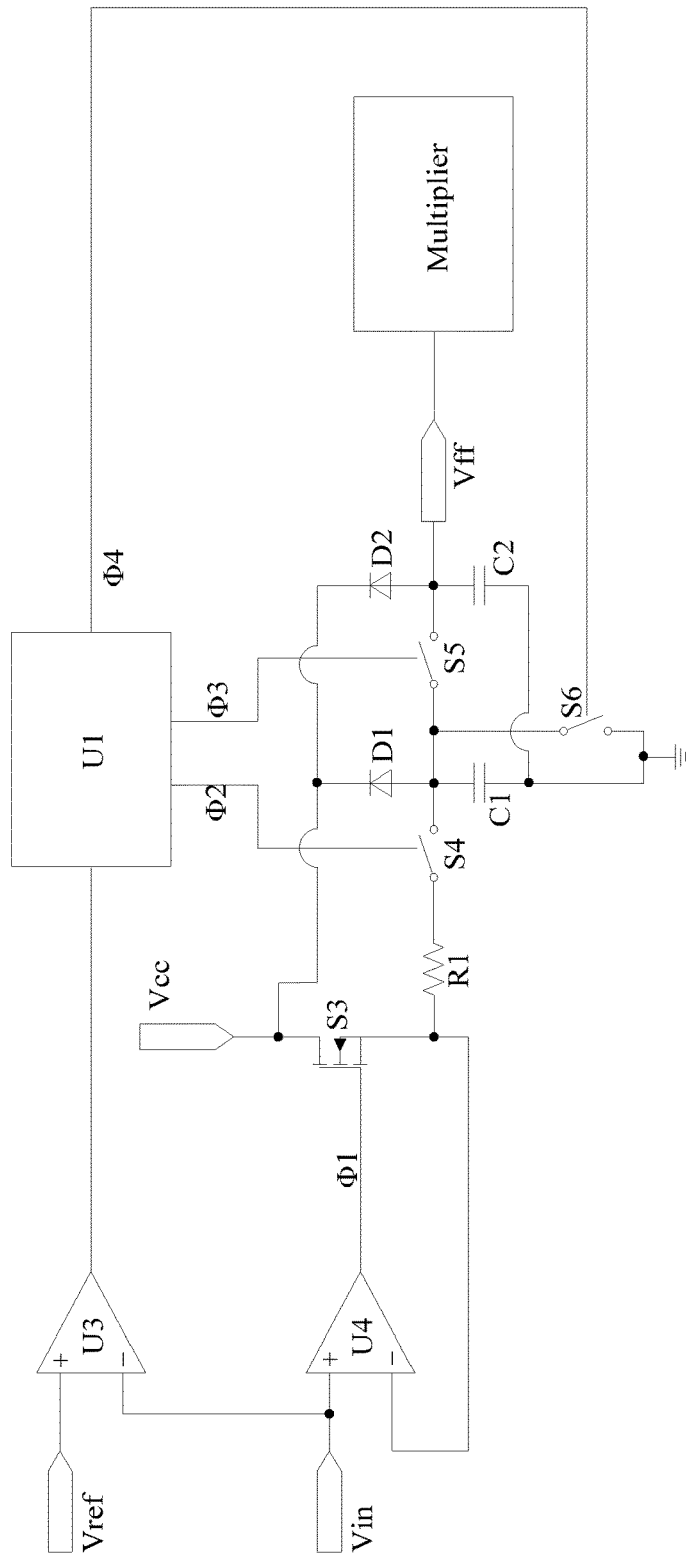
FIG. 9 is a schematic structural view of another voltage feed-forward circuit according to an exemplary embodiment of the present invention.

In the embodiment of the present invention, the logic control unit U2 can also be configured to output a fourth control signal Φ4 during a non peak voltage of the input voltage Vin. As shown in FIG. 9, the voltage feed-forward circuit in the embodiment of the present invention may also include a fourth switching element S4. The first terminal of the fourth switching element S4 is connected to the second terminal of the first capacitor C1, the second terminal of the fourth switching element S4 is grounded and the control terminal of the fourth switching element S4 is responsive to the fourth Control signal Φ4 to turn on the fourth switching element S4. The fourth control signal Φ4 turns on the fourth switching element S4 during the non-peak voltage of the input voltage Vin, and the first capacitor C1 is discharged to prevent that with a sudden decrease in the effective value of the input voltage Vin, the voltage of the second terminal of the first capacitor C1 is maintained at the peak voltage of the input voltage Vin before the change.

Continuing with reference to FIG. 9, the voltage feed-forward circuit described in the present exemplary embodiment may further include a first comparator U2. The first input terminal of the first comparator U2 is connected to a reference voltage Vref, and the second input terminal of the first comparator U2 is connected to the input voltage Vin. And the output terminal of the first comparator U2 outputs a comparison result signal of the input voltage Vin and the reference voltage Vref to the logic control unit U2. The logic control unit U2 determines hereby whether or not it is at the peak voltage of the input voltage Vin. For example, if the input voltage Vin is higher than the reference voltage Vref, the output terminal of the first comparator U2 outputs a low level signal, and the logic control unit U2 can hereby determine that is is at the peak voltage of the input voltage Vin period. If the input voltage Vin is less than the reference voltage Vref, the output terminal of the first comparator U2 outputs a high level signal, and the logic control unit U2 determines hereby it is at the non-peak voltage of the input voltage Vin period.

Continuing with reference to FIG. 9, the voltage feed-forward circuit described in the present exemplary embodiment may further include a second comparator U3 (or a second operational amplifier). The first input terminal of the second comparator U3 (or the second operational amplifier) is connected to the input voltage Vin, and second input terminal of the second comparator U3 (or the second operational amplifier) is connected to the first terminal of the third switching element S3 to form a feedback circuit. When the third switching element S3 is turned on, the output terminal of the second comparator U3 (or the second operational amplifier) outputs a comparison result signal to the control terminal of the third switching element S3 based on the comparison of the input voltage Vin and the voltage of the second terminal of the first capacitor C1. For example, the second comparator U3 (or the second operational amplifier) outputs a high level signal when the voltage of the second terminal of the first capacitor C1 is 0 in the initial stage when the fourth switching element S4 is turned on. The high level signals is the first control signal Φ1, thus conducting the first switching device, the power supply voltage Vcc charges the first capacitor C1 through the first switching transistor and the second switching transistor. The voltage of the second terminal of the first capacitor C1 rises in accordance with the rise of the input voltage Vin, but the voltage of the second terminal of the first capacitor C1 is still less than the peak voltage of the input voltage Vin, that is the first capacitor C1 is not yet finished being charged. So the second comparator U3 (or the second operational amplifier) still outputs a high level signal (i.e., the first control signal Φ1) so as to keep the first switching device conductive. The input voltage Vin has started to drop when the voltage of the second terminal of the first capacitor C1 is not less than the peak voltage of the input voltage Vin, and the first level charge is completed. Since the first capacitor C1 has no discharge path, it remains at the peak voltage of the input voltage Vin, the second comparator U3 (or the second operational amplifier) outputs a low level signal which turns off the first switching device to stop charging the first capacitor C1. Although the third switching element S3 is in the off state, the circuit between the second comparator U3 (or the second operational amplifier) and the third switching element S3 remains conductive to avoid the occurrence when the third switching element S3 is turned on again, the third switching element S3 abruptly charges the first capacitor C1, resulting in voltage overshoot. In addition, as shown in FIG. 9, the voltage feed-forward circuit may further include a third resistor R3. The third resistor R3 is coupled between the second terminal of the third switching element S3 and the second terminal of the first capacitor C1, thereby limiting the current.

Further, the voltage feed-forward circuit in the present exemplary embodiment is formed in an integrated circuit module, and the first capacitor C1 and the second capacitor C2 can be realized by using an on-chip capacitor. Because the on-chip capacitor is much smaller than the external capacitor and the AC signal cycle is longer (50 Hz corresponding 20 ms). If use the on-chip capacitor to replace the external capacitor, it is necessary to solve the problem of voltage holding time on the on-chip capacitor, that is, the influence of the leakage current needs to be taken into account, which is particularly severe at high temperatures. In the present exemplary embodiment, since the main leakage current is a reverse bias PN junction leakage current connected to the first capacitor C1 and the second capacitor C2. Therefore, as shown in FIG. 9, the voltage feed-forward circuit in the exemplary implementation also introduces a first reverse biased PN junction D1 and a second reverse biased PN junction D2 to balance the total leakage current. The first reverse bias PN junction D1 is coupled between the power supply voltage Vcc and the second terminal of the first capacitor C1; the second reverse bias PN junction D2 is coupled between the power supply voltage Vcc and the second terminal of the second capacitor C2. The first reverse bias PN junction D1 and the second reverse bias PN junction D2 are not conductive in the normal operating state and are in a reverse bias state. The leakage current flows from the power supply voltage Vcc into the first capacitor C1 and the second capacitor C2 through the first reverse bias PN junction D1 and the second reverse bias PN junction D2. The leakage current can compensate for the leakage current flowing out from the first capacitor C1 and the second capacitor C2.

In the present exemplary embodiment, two on-chip capacitors are used to achieve the hold and output of the peak voltage of the input voltage Vin without using an external resistor, thereby eliminating the ripple of the capacitor and avoiding the selection with compromise of the capacitance and the resistance value. Also, in the present exemplary embodiment, the leakage current compensation mechanism is provided to balance the total leakage current and increase the sustaining time of the voltage on the on-chip capacitor. The on-chip capacitor output voltage is approximately constant for the duration of the hold, which facilitates stabilizing the output of the multiplier, reducing THD (distortion), and improving the power factor correction effect.

Figure 11:
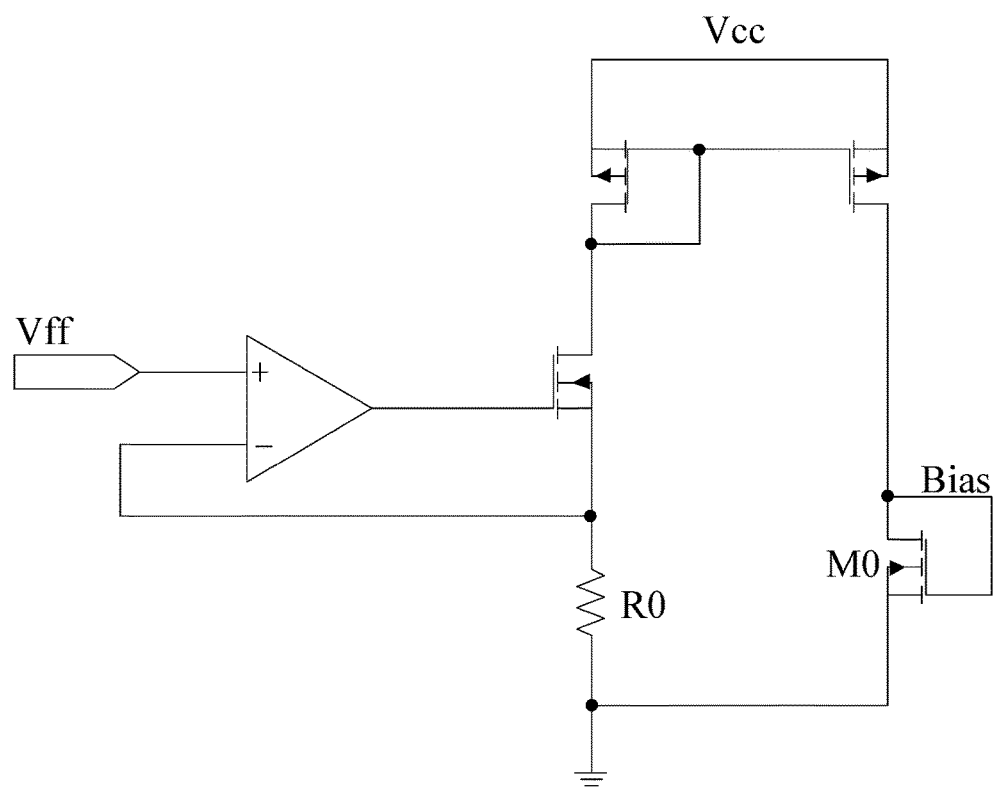
FIG. 11 is a schematic structural view of a voltage feed-forward circuit of the prior art.
Figure 12:
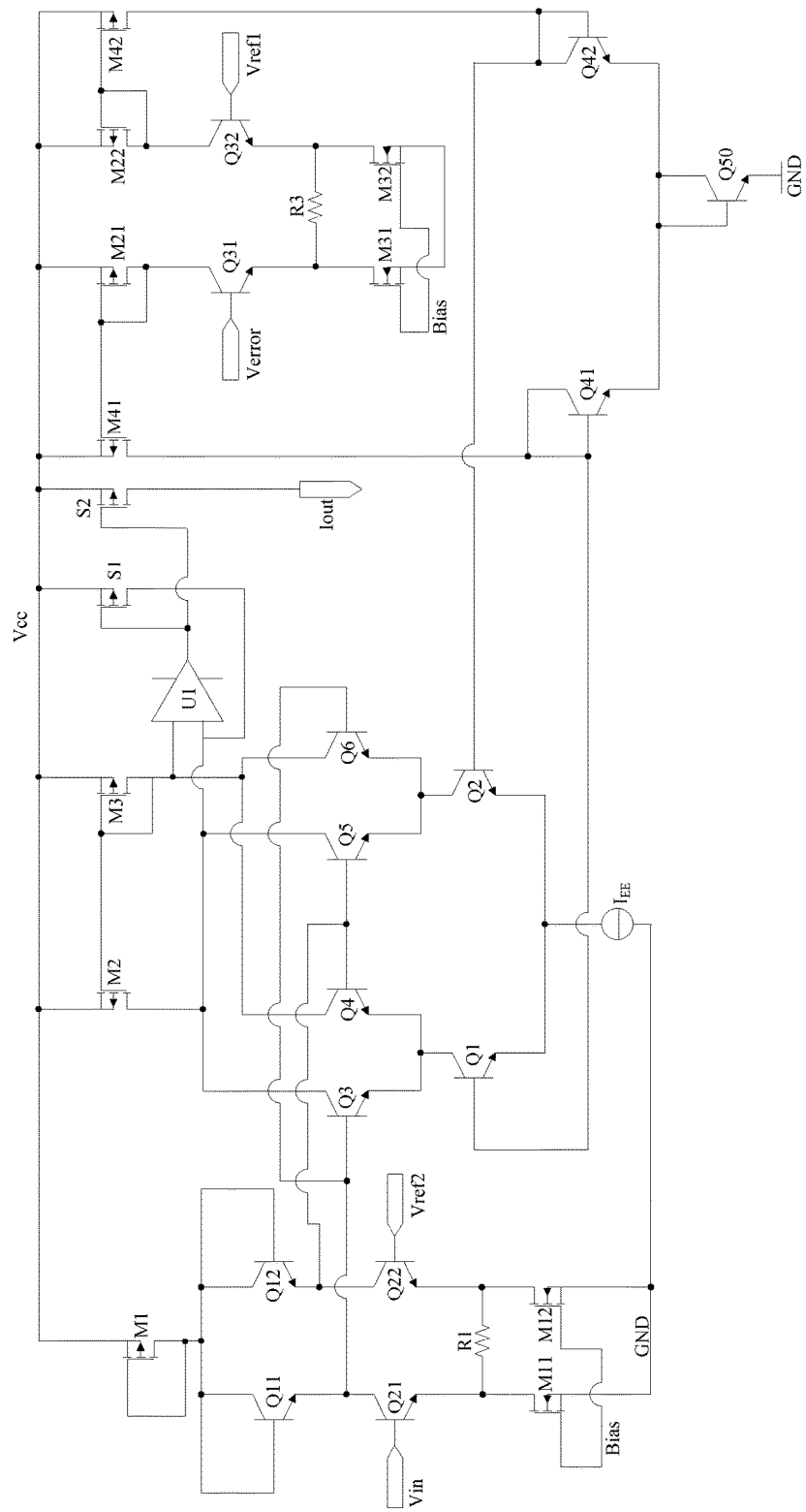
FIG. 12 is a schematic view showing the overall structure of a multiplier according to an exemplary embodiment of the present invention.

In this example embodiment, the bias current generating circuit can be as shown in FIG. 11, the overall multiplier circuit shown in FIG. 12. The bias current outputted by the MOSFET transistor M0 is:

$$IBias = V\!f\!f / R0 \qquad (3)$$

Example of second differential voltage conversion circuit in FIG. 6, the current of the first transistor Q11 emitter is:

$$IBias + (Vin - Vref2)/R1 \qquad (4)$$

The current of the first transistor Q12 emitter:

$$IBias - (Vin - Vref2)/R1 \qquad (5)$$

Thus, the differential voltage output of the differential voltage conversion circuit in FIG. 4 is:

$$2 \times Vt \times \tan h^{-1}(Vin - Vref2)/(R1 \times IBias) \qquad (6)$$

Substituting the bias current generated by the bias current generating circuit into equation (6) yields:

$$2 \times Vt \times \tan h^{-1}(Vin - Vref2) \times R0/(R1 \times V\!f\!f) \qquad (7)$$

The output of the graph Gilbert multiplier circuit is:

$$Iout = I_{EE} \times \tan h(V1/2Vt) \times \tan h(V2/2Vt) \qquad (8)$$

Where $I_{EE}$ is the tail current value, V1, V2 are two pairs of input voltages, Iout is the output current.

Substituting (7) into (8) yields:

$$Iout = I_{EE} \times (Vin1 - Vref1) \times (Vin2 - Vref2)/V\!f\!f^2 \qquad (9)$$

Formula (9) shows that the circuit contains a $1/V\!f\!f^2$ item that is to achieve the function of voltage feed-forward.

A power factor correction circuit is also provided in the present exemplary embodiment. The power factor correction circuit includes any one of the multipliers provided in the present exemplary embodiment. The power factor correction circuit may be formed in an integrated circuit module, and the first capacitor C1 and the second capacitor C2 are on-chip capacitors. With respect to the power factor correction circuit in the present exemplary embodiment, the specific implementation method and the technical effect of the multiplier have been described in detail. The description will not be described here in detail.

In summary, in the multiplier of the exemplary embodiment of the present invention, feedback control is provided by the feedback control unit by providing the feedback control unit to improve the accuracy of the output current of the multiplier, and it is ensured that when the input voltage error is zero, there is no current output, that is, more accurate control of the multiplier offset voltage. In addition, in the multiplier of the exemplary embodiment of the present invention, since the PNP transistor is not used, the requirement for the process can be reduced and the application range of the circuit can be exterminated. Also, in the voltage feed-forward circuit of the exemplary embodiment of the present invention, the peak voltage of the input voltage is realized by providing the first capacitance and the second capacitance, so that it is not necessary to take into account the selection with compromise between the external resistor and the external capacitance in the prior art select. Moreover, since the hold of the peak voltage of the input voltage is achieved based on the sharing and redistribution of the charge between the first capacitor and the second capacitor, it is possible to make the output voltage change slowly, facilitating the filtering of the transient fluctuation of the input voltage. At the same time, by changing the ratio of the first capacitor and the second capacitance, the change slope of the output voltage can be changed. The first capacitor and the second capacitor can be implemented using on-chip capacitors, thus saving system cost. In addition, in the present exemplary embodiment, by setting the leakage current compensation mechanism, the sustaining time of the voltage on the internal capacitor is increased so that the output voltage is approximately constant during the sustaining time, which facilitates the stabilization of the multiplier.

The invention has been described by the above relative embodiments, while the above embodiments are only examples to implement the invention. It should be pointed that, the disposed embodiments are not limitations to the invention. Rather, the amendments and embellishing without departing from the spirit and scope of the invention, all belong to the protection scope of the invention.

What is claimed is:

1. A multiplier comprising:
   a Gilbert multiplier circuit comprising a first differential input stage, a second differential input stage and an output stage; said output stage outputting the output current calculated by the input of said first differential input stage and the input of the second differential input stage;
   a first differential voltage conversion circuit configured to generate a first differential voltage to bias said first differential input stage based on an error feedback voltage signal and a first reference voltage;
   a second differential voltage conversion circuit configured to generate a second differential voltage to bias said second differential input stage based on an input voltage and a second reference voltage; and
   a bias current generating circuit configured to generate a bias current to bias a first signal conversion circuit and a second signal conversion circuit;
   wherein said output stage comprises:
   a current mirror unit comprising two current input terminals and a current output terminal; and
   a feedback control unit configured to ensure that the current output terminal does not output current when the voltage difference received by the multiplier is zero;
   wherein the feedback control unit includes
   a first operational amplifier comprising two input terminals connected to the current input terminals of said current mirror unit respectively;
   a first switching element comprising a first terminal connected to the current output terminal of said current mirror unit, a second terminal connected to one input terminal of said first operational amplifier, and a control terminal connected to an output terminal of said first operational amplifier; and
   a second switching element comprising a first terminal connected to the current output terminal of said current mirror unit, a second terminal configured to output said output current, and a control terminal connected to the output terminal of said first operational amplifier.

2. The multiplier according to claim 1, wherein said current mirror unit is composed of a P type MOSFET transistor.

3. The multiplier according to claim 1, wherein said second differential voltage conversion circuit comprises:
   a MOSFET transistor comprising a gate electrode, a drain electrode connected to said gate electrode, a source electrode connected to a supply voltage;
   a pair of first BJT transistors comprising two NPN type first BJT transistors, base electrodes and collector electrodes of two said first BJT transistors connected to the drain electrode of said MOSFET transistor; emitter electrodes outputting said second differential voltage;
   a pair of second BJT transistors comprising two NPN type second BJT transistors, base electrodes of two said second BJT transistors receiving two different voltage signals respectively, collector electrodes connected to the emitter electrodes of said first BJT transistors respectively;
   a first resistor coupled between the emitter electrodes of two said second BJT transistors; and
   a pair of first MOSFET transistors comprising two first MOSFET transistors; gate electrodes of two said first MOSFET transistors receiving said bias current, source electrodes grounded, and drain electrodes connected to the emitter electrodes of said second BJT transistors respectively.

4. The multiplier according to claim 3, wherein the base electrode of one said second BJT transistor receives said input voltage or an error feedback voltage, and the base electrode of the other said second BJT transistors receives said second reference voltage.

5. The multiplier according to claim 1, wherein said first differential voltage conversion circuit comprises:
   a pair of second MOSFET transistors comprising two second MOSFET transistors, gate electrodes of two said second MOSFET transistors connected to drain electrodes, source electrodes connected to said supply voltage;
   a pair of third BJT transistors comprising two third BJT transistors, base electrodes of two said third BJT transistors receiving two different voltage signals respectively, collector electrodes connected to the drain electrodes of said second MOSFET transistors respectively;
   a second resistor coupled between the emitter electrodes of said third BJT transistor;
   a pair of third MOSFET transistors comprising two third MOSFET transistors, gate electrodes of two said third MOSFET transistors receiving said bias current, source electrodes grounded, and drain electrodes connected to the emitter electrodes of said third BJT transistor respectively;
   a pair of fourth MOSFET transistors comprising two fourth MOSFET transistors; gate electrodes of two said fourth MOSFET transistors connected to the gate electrodes of said second MOSFET transistors respectively; source electrodes connected to said supply voltage;
   a pair of fourth BJT transistors comprising two NPN type fourth BJT transistors, base electrodes of two said fourth BJT transistors connected to the drain electrodes of said fourth MOSFET transistors respectively, collector electrodes outputting said first differential voltage;
   a BJT transistor comprising a base electrode, a collector electrode connected to said base electrode and the emitter electrodes of said fourth BJT transistors, and an emitter electrode grounded.

6. The multiplier according to claim 5, wherein the base electrode of one said third BJT transistor receives said input voltage or an error feedback voltage, and the base electrode of the other said third BJT transistor receives said first reference voltage.

7. The multiplier according to claim 1, wherein said multiplier further comprises:
   a voltage feed-forward circuit, the bias current generating circuit generates said bias current based on a voltage supplied from said voltage feed-forward circuit.

8. A power factor correction circuit comprising a multiplier, wherein the multiplier includes:
   a Gilbert multiplier circuit comprising a first differential input stage, a second differential input stage and an output stage; said output stage outputting the output current calculated by the input of said first differential input stage and the input of the second differential input stage;
   a first differential voltage conversion circuit configured to generate a first differential voltage to bias said first differential input stage based on an error feedback voltage signal and a first reference voltage;
   a second differential voltage conversion circuit configured to generate a second differential voltage to bias said second differential input stage based on an input voltage and a second reference voltage; and a bias current generating circuit configured to generate a bias current to bias a first signal conversion circuit and a second signal conversion circuit;

wherein said output stage comprises:

a current mirror unit comprising two current input terminals and a current output terminal; and a feedback control unit configured to ensure that the current output terminal does not output current when the voltage difference received by the multiplier is zero;

wherein the feedback control unit includes a first operational amplifier comprising two input terminals connected to the current input terminals of said current mirror unit respectively;

a first switching element comprising a first terminal connected to the current output terminal of said current mirror unit, a second terminal connected to one input terminal of said first operational amplifier, and a control terminal connected to an output terminal of said first operational amplifier; and a second switching element comprising a first terminal connected to the current output terminal of said current mirror unit, a second terminal configured to output said output current, and a control terminal connected to the output terminal of said first operational amplifier.

9. The power factor correction circuit according to claim 8, wherein the power factor correction circuit is formed in an integrated circuit module.

* * * * *